United States Patent
Owen (10) Patent No.: US 9,997,439 B2
(45) Date of Patent: Jun. 12, 2018

(54) METHOD FOR FABRICATING AN ADVANCED ROUTABLE QUAD FLAT NO-LEAD PACKAGE

(71) Applicant: QUALCOMM TECHNOLOGIES International, Ltd., Cambridge (GB)

(72) Inventor: Martyn Robert Owen, Bury St Edmunds (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 14/701,404

(22) Filed: Apr. 30, 2015

(65) Prior Publication Data

US 2016/0322237 A1 Nov. 3, 2016

(51) Int. Cl.
*H01L 23/495* (2006.01)
*H01L 21/48* (2006.01)
*H01L 23/31* (2006.01)

(52) U.S. Cl.
CPC .... *H01L 23/49582* (2013.01); *H01L 21/4832* (2013.01); *H01L 23/49517* (2013.01); *H01L 23/49541* (2013.01); *H01L 23/49548* (2013.01); *H01L 23/49558* (2013.01); *H01L 23/3107* (2013.01); *H01L 2224/48091* (2013.01); *H01L 2224/48247* (2013.01); *H01L 2224/48257* (2013.01); *H01L 2224/73265* (2013.01)

(58) Field of Classification Search
CPC ............. H01L 21/4825; H01L 21/4828; H01L 21/565; H01L 23/49503; H01L 23/4952; H01L 23/49582
USPC ......................................... 257/666, 672, 676
See application file for complete search history.

(56) References Cited

U.S. PATENT DOCUMENTS

| 7,009,286 B1 | 3/2006 | Kirloskar et al. |
| 7,939,935 B2* | 5/2011 | Chinda ............... H01L 21/4853 257/700 |
| 2007/0268675 A1 | 11/2007 | Chinda et al. |
| 2009/0102063 A1* | 4/2009 | Lee ........................ H01L 21/486 257/778 |
| 2009/0174053 A1 | 7/2009 | Ikenaga et al. |

(Continued)

FOREIGN PATENT DOCUMENTS

WO 2013075383 A1 5/2013

OTHER PUBLICATIONS

Lu, C. T. et al., "Advanced QFN Packaging with Trace Routing Design," Microsystems, Packaging, Assembly and Circuits Technology Conference (IMPACT), 2014 9th International, Oct. 22-24, 2014, pp. 331- 334.

(Continued)

*Primary Examiner* — Hung Vu
(74) *Attorney, Agent, or Firm* — Procopio, Cory, Hargreaves (57) ABSTRACT

An improved leadframe assembly for use in a quad flat no lead (QFN) package is described along with a method of fabricating both the leadframe assembly and the QFN package. The leadframe assembly comprises an etch-stop layer formed on a topside of a substrate and a routing layer (or trace) formed on a topside of the etch-stop layer. The etch-stop layer prevents etching of an underside of the routing trace and the leadframe assembly may also comprise a top plating layer formed on a topside of the routing layer and which prevents etching of the topside of the routing trace.

8 Claims, 12 Drawing Sheets

(56) References Cited

U.S. PATENT DOCUMENTS

2009/0283884 A1    11/2009  Kang et al.
2013/0069241 A1*   3/2013   Lin .................... H01L 24/97
                                                      257/774
2015/0090481 A1    4/2015   Sun

OTHER PUBLICATIONS

Lai, Y. et al., "Development and Performance Characterizations of a QFN/HMT Package," 2008 58th Electronic Components and Technology Conference, May 2008, pp. 964-967.
International Search Report and Written Opinion—PCT/EP2016/059502—ISA/EPO—dated Jul. 22, 2016.

* cited by examiner

METHOD FOR FABRICATING AN ADVANCED ROUTABLE QUAD FLAT NO-LEAD PACKAGE

BACKGROUND

Multi-row QFN packages (such as aQFN™) are enhanced versions of conventional QFN packages which allow the I/O number to approach that of a BGA-type chip-scale package (CSP). Multi-row QFN is often the preferred solution for electrical components of portable telecommunication devices such as IrDA, Bluetooth™, RFID, etc. for its superior thermal, electrical performance and reliability and miniaturized package size.

Figure 1A:
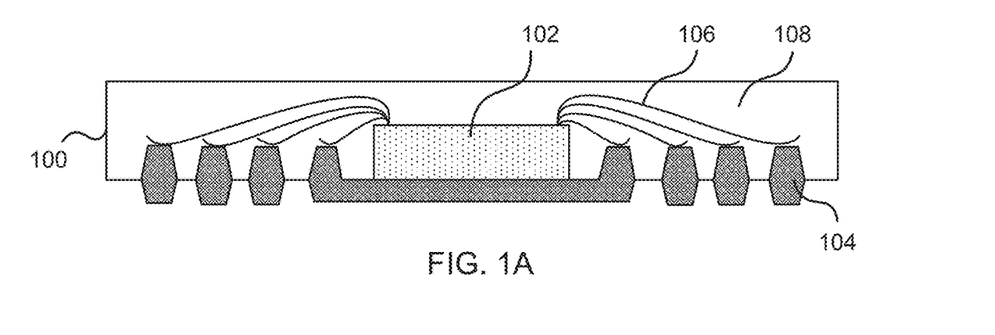
FIG. 1A is a schematic diagram showing a cross-sectional view of an aQFN package with multiple rows of pads.
Figure 1B:
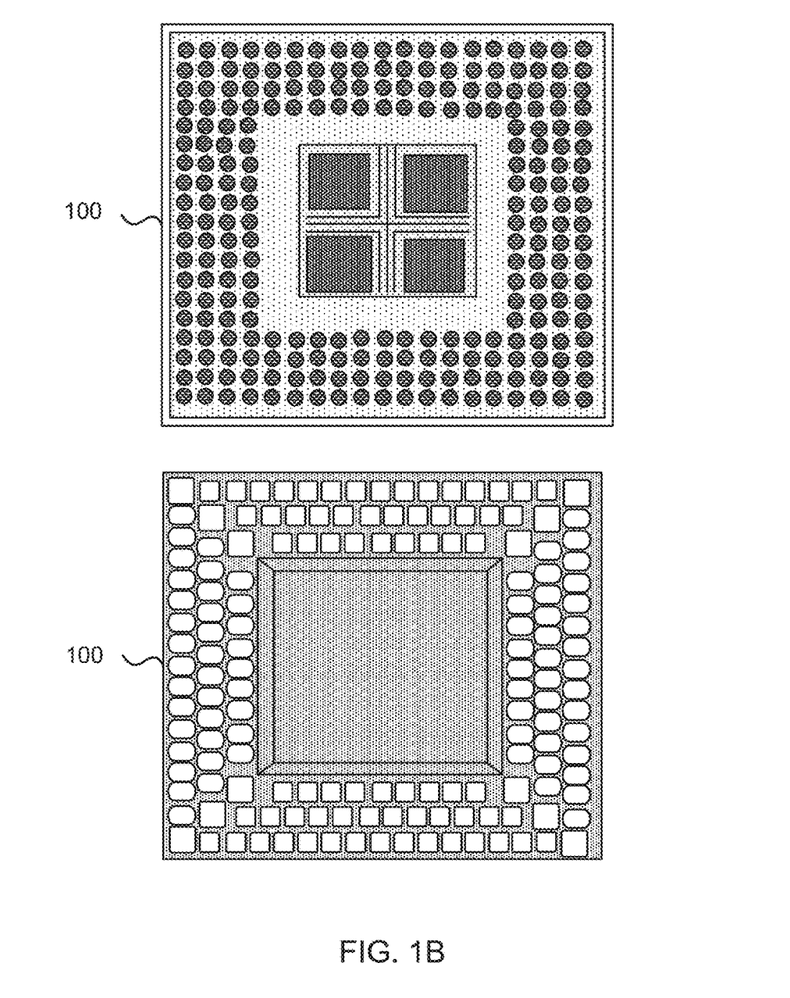
FIG. 1B is a schematic diagram showing a top plan view and a bottom view of an aQFN package with multiple rows of pads.

FIG. 1A is a schematic diagram showing a cross-sectional view of a multi-row QFN package 100 with multiple rows of pads. A die 102 is attached to the leadframe. Wires 106 electrically couple the die 102 to a plurality of wirebond posts 104 arranged at different distances to the die. Resin 108 bonds the die 102, the wires 104, the leadframe and isolated wirebond posts 104 together and protects them from damage. FIG. 1B is a schematic diagram showing both a top plan view and a bottom view of a multi-row QFN package with multiple rows of pads.

Compared to the multi-row QFN package, a QFN package with a single row of pads has the advantage that its simple arrangement makes it easier (and hence lower cost) to surface mount, reduces the possibility of solder bridging between I/Os and allows easier visual inspection of all the solder joints once soldered to a Printed Circuit Board (PCB). However, if only a single row of pads is used this can lead to very long wirebonds in the case of large numbers of I/Os and/or a small die (e.g. where there are more pads than can fit around the periphery of the die, the package is made larger so that the pads fit around the periphery of the package and wirebonds connect the die to these pads).

The embodiments described below are not limited to implementations which solve any or all of the disadvantages of known methods of forming a QFN package.

SUMMARY

This Summary is provided to introduce a selection of concepts in a simplified form that are further described below. This Summary is not intended to identify key features or essential features of the claimed subject matter, nor is it intended to be used as an aid in determining the scope of the claimed subject matter.

An improved leadframe assembly for use in a quad flat no lead (QFN) package is described along with a method of fabricating both the leadframe assembly and the QFN package. The leadframe assembly comprises an etch-stop layer formed on a topside of a substrate and a routing layer (or trace) formed on a topside of the etch-stop layer. The etch-stop layer prevents etching of an underside of the routing trace and the leadframe assembly may also comprise a top plating layer formed on a topside of the routing layer and which prevents etching of the topside of the routing trace.

A first aspect provides a method of fabricating a leadframe assembly for use in a QFN package, comprising forming an etch-stop layer on a topside of a substrate; and forming a routing trace on a topside of the etch-stop layer such that the etch-stop layer is arranged to prevent etching of an underside of the routing trace.

A second aspect provides a leadframe assembly for use in fabricating a QFN package, the leadframe assembly comprising a substrate; a routing trace; and an etch-stop layer positioned between a topside of the substrate and an underside of the routing trace, wherein the etch-stop layer is arranged to prevent etching of the underside of the routing trace.

A third aspect provides a QFN package comprising: a leadframe assembly comprising a substrate, a routing trace; and an etch-stop layer positioned between a topside of the substrate and an underside of the routing trace, wherein the etch-stop layer is arranged to prevent etching of the underside of the routing trace, a die, a wire electrically coupling the die to the top plating of the leadframe assembly, and molding material bonding the die, the wire and the leadframe assembly together.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features.

DESCRIPTION OF THE EMBODIMENTS

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 2A:
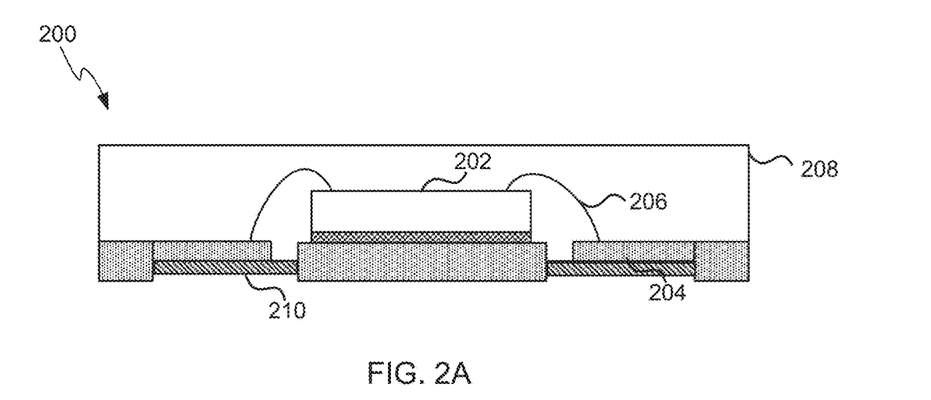
FIG. 2A is a schematic diagram showing a cross-sectional view of a routable QFN package with a single row of pads.
Figure 2B:
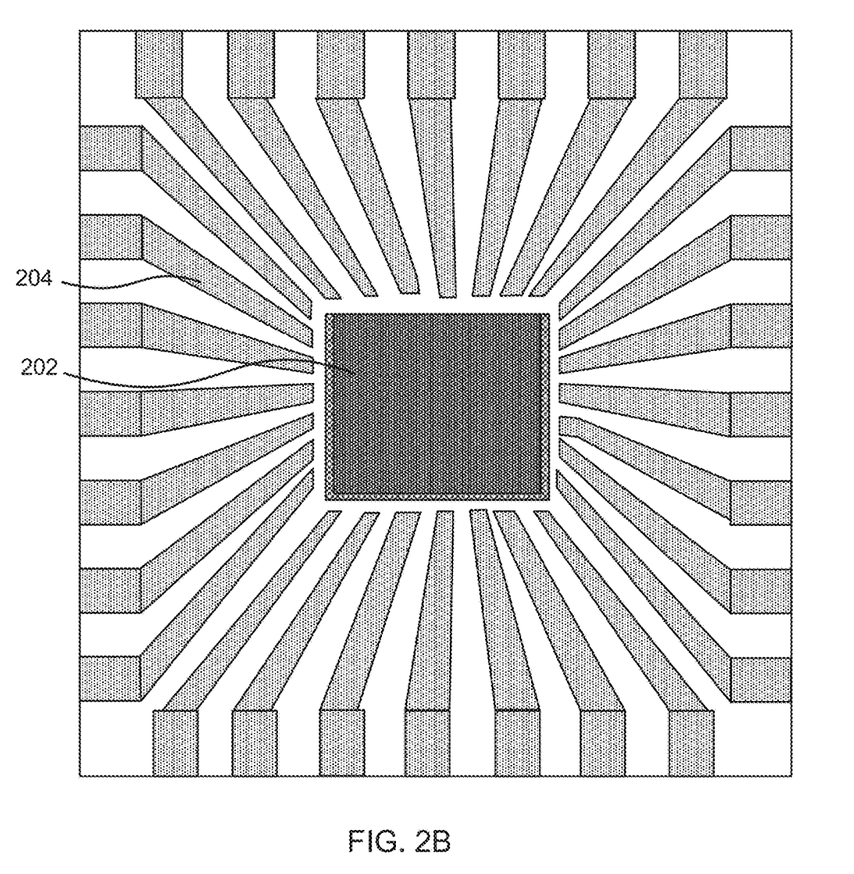
FIG. 2B is a schematic diagram showing a top plan view of a routable QFN package with a single row of pads.

FIG. 2A is a schematic diagram showing a cross-sectional view of a routable QFN package 200 with a single row of pads which eliminates the very long wirebonds described above through the use of routing traces 204 formed in the leadframe. FIG. 2B is schematic diagram showing a top plan view of a routable QFN package 200. The routing traces 204, which are formed from half-etched leadframe, provide a fan out from smaller (e.g. narrower) wirebond pads close to the die to the larger package I/O pads around the periphery of the package. A die 202 is attached to the leadframe and wires 206 electrically couple the die 202 to the plurality of routing traces 204. Resin 208 bonds the die 202, the wires 206 and the leadframe (including the half-etched routing traces 204) together and protects them from damage. A mask 210 may be deposited on the underside of the package to cover the exposed routing traces 204.

Figure 3:
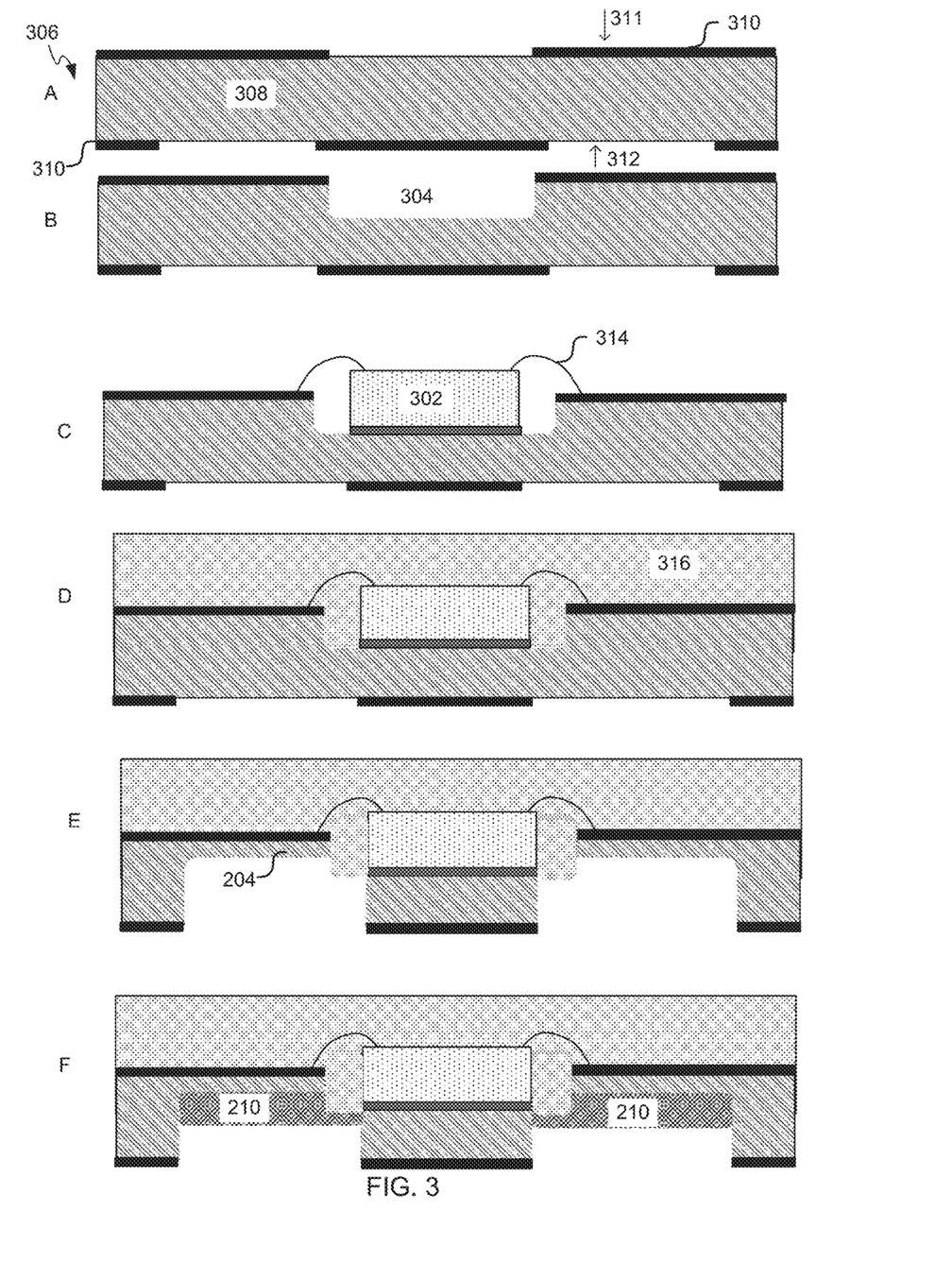
FIG. 3 shows schematic diagrams of a cross-sectional view of a routable QFN package during an exemplary fabrication process where the die is mounted in a recess in the leadframe.
Figure 4:
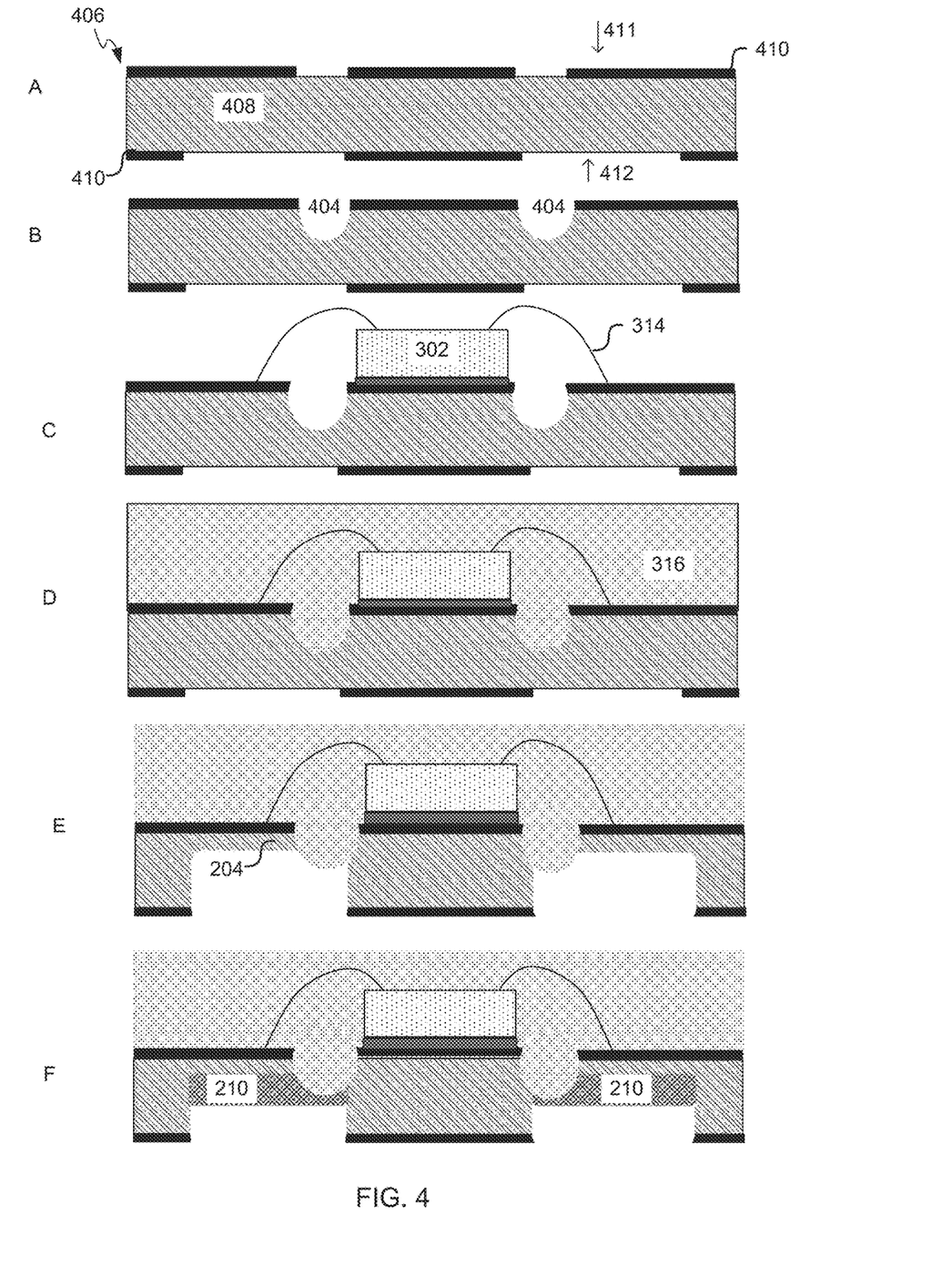
FIG. 4 shows schematic diagrams of a cross-sectional view of a routable QFN package during an exemplary fabrication process where the die is not mounted in a recess in the leadframe.

FIGS. 3 and 4 show schematic diagrams of a cross-sectional view of a routable QFN package during an exemplary fabrication process. In FIG. 3 the die 302 is mounted in a half-etched recess 304 (or cavity) within the leadframe 306, whereas in FIG. 4 the die 302 is not mounted in a recess in the leadframe 406. Use of a cavity (as shown in FIG. 3) allows possible die stacking and low-profile of the leadframe, without the need of excessive thinning of the die.

The first two diagrams, A and B, in both FIGS. 3 and 4 show the fabrication of the leadframe 306, 406. This may be formed by applying photoresist of a certain pattern onto both the topside and the underside of a copper (Cu) substrate 308, 408. The pattern of the photoresist may be formed on the Cu substrate 308, 408 by photolithography. In various examples, it is formed by first forming a uniform photoresist layer on the Cu substrate, exposing certain parts of the photoresist layer to UV light through a mask so that the exposed parts of the photoresist becomes soluble to photoresist developer, and then using the photoresist developer or any other suitable means to remove the exposed parts of the photoresist, leaving the unexposed parts of the photoresist on the topside/underside of the Cu substrate 308, 408.

A plating layer 310, 410 is then plated on both the topside and the underside of the Cu substrate 308, 408 in places where no photoresist is present. The plating 310, 410 may be made of Ni (Nickel), Pd (Palladium), Au (Gold) or NiPdAu. Subsequently, the photoresist is washed away by photoresist developer or removed by any other suitable means from both sides of the Cu substrate 308, 408. In one example, the photoresist is removed by photoresist developer after being exposed to UV light. This leaves only the plating 310, 410 on both sides of the Cu substrate 308, 408.

The photolith process results in a Cu substrate 308, 408 with a patterned plating layer on both the top (or front) side (indicated by arrow 311, 411) and the under (or back) side (indicated by arrow 312, 412), as shown in the first diagrams, A, in FIGS. 3 and 4. It will be appreciated that this structure (and other similar structures in the following examples) may alternatively be formed by processes other than photolithography.

The second diagrams, B, in FIGS. 3 and 4 show that the topside of the Cu substrate 308, 408 of the leadframe assembly is then half-etched (on the front side 311, 411) to partially separate the routing traces from each other. In the example in FIG. 3, this front side etch also forms the recess 304 to accommodate the die 302 and in the example in FIG. 4, the front side etch also forms recesses 404 which partially separate the routing traces from the portion of the leadframe onto which the die 302 will be attached. The Cu substrate 308, 408 may be half-etched using any known etchant suitable for etching copper or copper alloy. The plating 310, 410 is resistant to the etchant and protects the portions of Cu substrate 308, 408 directly underneath it from the etchant.

The third diagrams, C, in FIGS. 3 and 4 shows a cross-sectional view of the leadframe after the die 302 has been attached and wires 314 have been wire bonded between the die 302 and the routing traces. The wires 314 may be made of gold (Au) or any other suitable electrically conductive material (e.g. copper, which may be coated in gold or gold and palladium). Subsequently, molding is performed as shown in the fourth diagrams, D, in FIGS. 3 and 4 such that resin 316 is solidified to hold the wires 314 permanently in place and hold the wires 314, die 302 and leadframe assembly 306, 406 together to form an integral piece.

As shown in the fifth diagrams, E, in FIGS. 3 and 4, the Cu leadframe 306, 406 undergoes a second etching process at its underside so that the routing traces are separated and hence form isolated Cu structures (which resemble a springboard in cross-section). Finally a mask 210 may be deposited on the underside of the package, as shown in the diagrams, F, to cover the underside of the exposed routing traces 204.

In order to fabricate a multi-row QFN as shown in FIGS. 1A and 1B, the back-side and front-side etches do not need to be carefully controlled (i.e. it does not need to be a carefully timed etch) as the combination of the front-side etch and the back-side etch etches all the way through the Cu substrate. In contrast, when fabricating a routable QFN as shown in FIGS. 2A and 2B (e.g. using the process as described with reference to FIGS. 3 and 4) which comprises half-etched routing traces 204, the back-side etch must be carefully controlled to ensure that the traces 204 are not etched away (e.g. by etching too deeply when performing the back-side etch).

In order to fabricate a routable QFN as shown in FIGS. 2A and 2B, the etching of the Cu substrate 302 is controlled by timing the etch. However, it is generally difficult to precisely control timed etching, resulting in a large variation in the routing trace thicknesses (due to under-etching or over-etching) and subsequently causing packaging problems due to the routing traces being too thin or too thick. There can also be a lack of uniformity across the etch tank, leading to different thicknesses among routable QFN packages formed on the same leadframe (and hence etched at the same time) and potentially also different thicknesses between different routing traces on the same routable QFN package or among different parts of a routing trace. In order to ensure that traces are not etched away by this process, the feature sizes (minimum track width and minimum gap) of a routable QFN are typically limited to around the same dimension as the thickness of the leadframe (e.g. 100-200 μm).

An advanced routable QFN (ARQFN) is described herein along with methods of fabricating an ARQFN.

FIGS. 5A-5F are schematic diagrams showing cross-sectional views of an ARQFN package during its various fabrication stages according to a first embodiment.

Figure 5A:
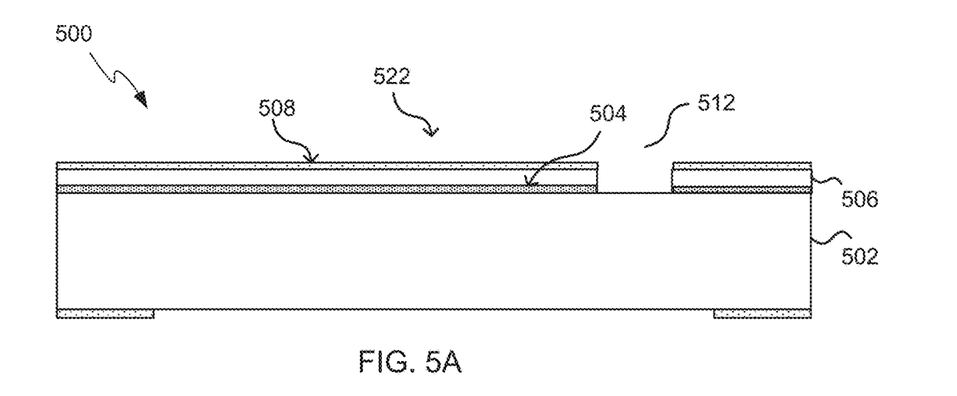
FIGS. 5A-5F are schematic diagrams showing cross-sectional views of an advanced routable QFN (ARQFN) package during an exemplary process for fabricating the ARQFN package according to a first embodiment and where the die is not mounted in a recess in the leadframe.
Figure 5B:
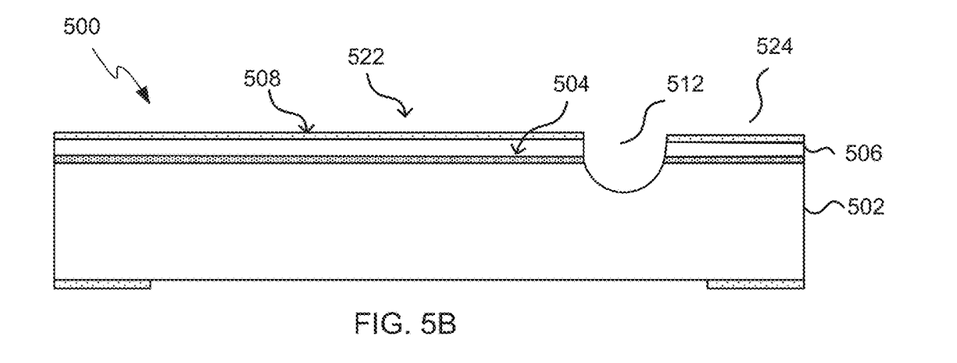

FIGS. 5A and 5B show the fabrication of an improved leadframe assembly 500 which comprises a Cu substrate (or sheet) 502, an etch-stop plating layer 504 formed on top of the Cu substrate, a Cu plating layer 506 (which may also be referred to as a Cu routing layer) formed on top of the etch-stop plating, and a top plating layer 508 formed on top of the Cu plating layer 506. The etch-stop plating layer 504 may be made of Ni, NiPd or NiPdAu. The top plating layer 508 may be made of NiPdAu. The layers 504 and 508 may be made of the same material (e.g. NiPdAu) or different materials.

The etch-stop plating layer 504. The at least one gap in the etch-stop plating layer 504 may be formed by a photolithography process similar to the process for forming discrete portions of plating 310, 410 as described above: firstly a uniform photoresist layer is formed on the topside of the Cu substrate 502; certain portions of the photoresist layer are then exposed to UV light through a mask so that the exposed parts of the photoresist becomes soluble to photoresist developer; the exposed parts of the photoresist are then washed away by photoresist developer or removed any other suitable means, leaving the unexposed parts of the photoresist on topside of the Cu substrate 502; the etch-stop plating is then plated on portions of the topside of the Cu substrate 502 where photoresist has been washed away (and not where the photoresist remains, thereby forming the at least one gap 512. A Cu plating layer 506 is then plated onto the etch-stop plating 504 and the top plating layer 508 is plated on top of the Cu plating layer, as shown in FIG. 5A. Subsequently, all the remaining photoresist is removed by a photoresist developer or any other suitable means. The plating of these two layers 506, 508 may use the same photoresist patterning as is used to plate the etch-stop plating (as described above, with the patterned resist being removed only after all three layers 504-508 have been plated) or alternatively the photoresist may be removed and new photoresist applied (and patterned) in order to control the pattern of one or both of the subsequent layers 506, 508 and where new photoresist is used, it will appreciated that the subsequent layers may use the same mask dimensions (such that the layers are the same size and shape) or different mask dimensions.

As shown in FIG. 5B, subsequently etching is performed from the topside of the leadframe 500 such that at the gap 512, the topside of the Cu substrate 502 is partially etched. This etch starts to separate the at least one routing trace 522 from the die supporting platform 524 (only part of which is shown in FIGS. 5A-5F) and also starts to laterally separate the different routing traces 522 (i.e. where there are a plurality of routing traces 522). As shown in FIG. 5B the routing trace(s) 522 and the die supporting platform 524 are not completely separated by this topside etch because they remain connected by the majority of the thickness of the Cu substrate 502. The top plating layer 508 is resistant to etchant and protects the portions of Cu plating layer 506 and Cu substrate 502 directly underneath it from etching. The etching may be performed using any known etchant suitable for etching copper or copper alloy. There may be some sideways etching of the Cu plating layer 506 (e.g. between the two plating layers 504, 508); however, this will be limited.

The top/front-side etch (shown in FIG. 5B) may be shallower than the corresponding front-side etch in the previously described process (as shown in the second diagrams, B, in FIGS. 3 and 4) as it only needs to create a shallow opening in the Cu substrate 502 as the majority of the Cu that needs to be removed to fully separate the routing traces and die supporting platform will be removed in a later back-side etch process.

Figure 5C:
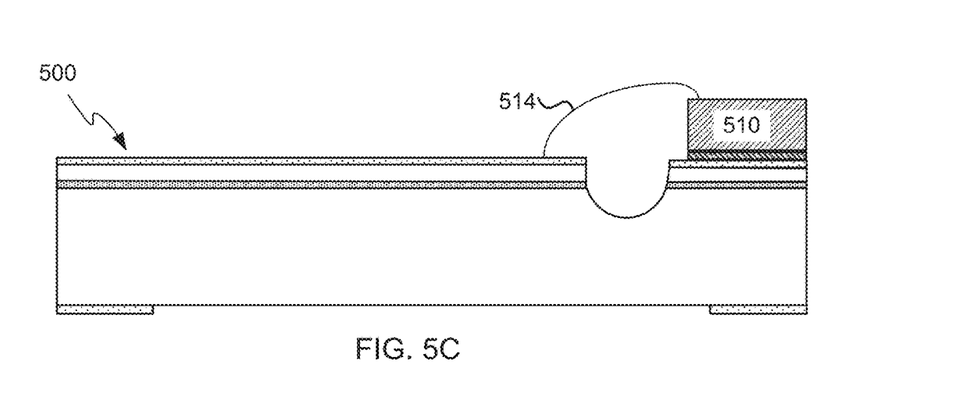

As shown in FIG. 5C, a die 510 (only part of which is shown in FIG. 5C) is then attached to the die supporting platform 524 of the top plating player of the leadframe 500. At least one wire 514 is then wire bonded between the die 510 and the top plating of the routing trace 522. The at least one wire 514 may be made of gold or any other suitable conductive material.

Figure 5D:
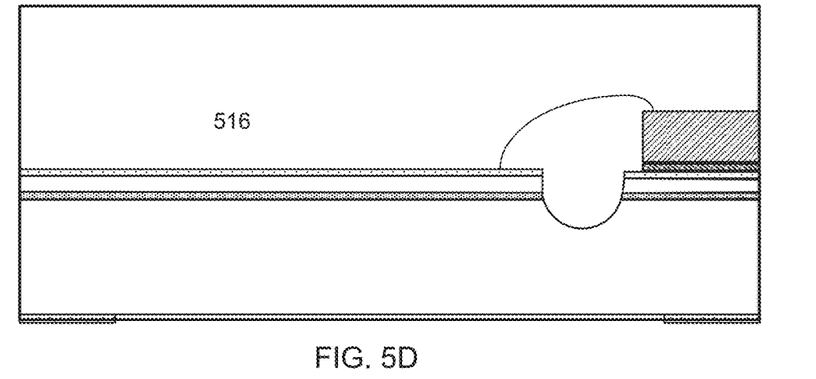
Figure 5E:
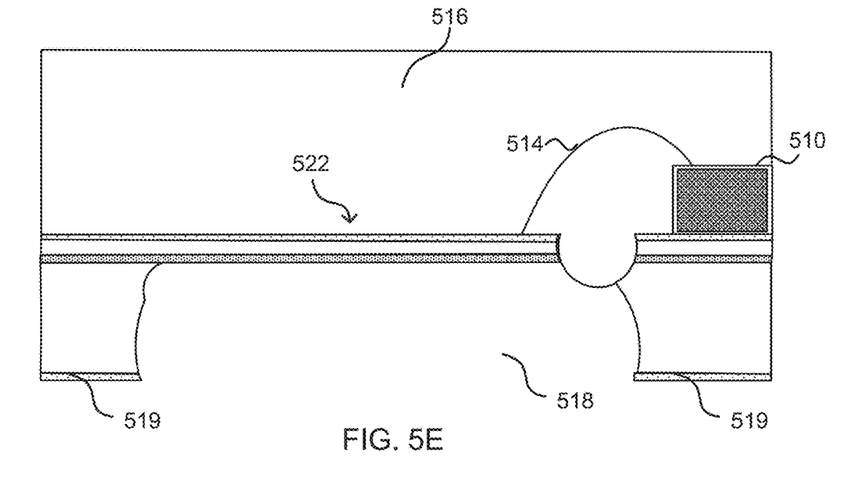

Molding is then performed on the topside of the leadframe 500, as shown in FIG. 5D, during which resin 516 is deposited and solidified on the leadframe 500 to hold the wires 514 permanently in place and hold various components (including parts of the leadframe) together as an integral piece. The Cu substrate 502 then undergoes a backside etching process, as shown in FIG. 5E to form a cavity 518 and isolate (i.e. separate) the routing trace(s) 522, die supporting platform 524 and back-side contacts 519. The backside etching of the copper substrate 502 stops at the etch-stop plating layer 504 which is resistant to the etchant and protects the Cu plating layer 506 from etching.

Figure 5F:
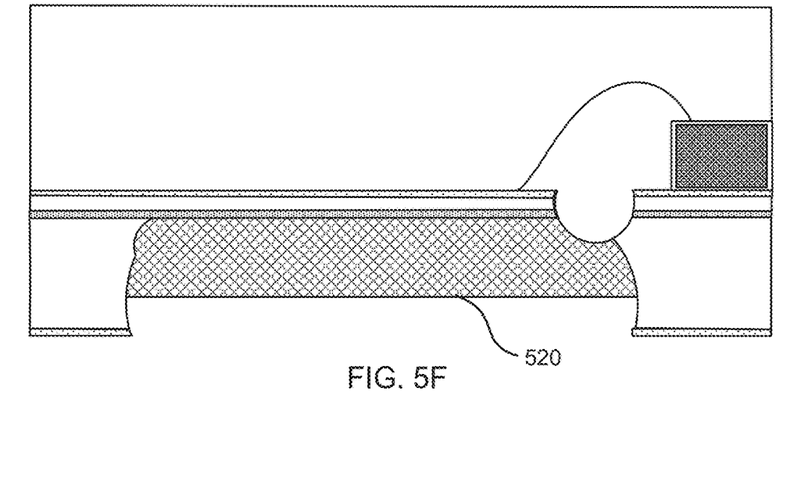

As shown in FIG. 5F, the exposed underside of the leadframe 500 in the cavity 518 may be subsequently protected by soldermask material 520. This soldermask is non-conductive and helps to avoid electrical shorts caused by solder bridging between pads 519 on the back-side when the package is soldered onto a PCB.

Compared to the process described with reference to FIGS. 3 and 4, the process as shown in FIGS. 5A-5F allows much more precise control of the backside etching. It uses an etch-stop plating layer to prevent the routing traces 522 formed by the Cu plating layer 506 from being etched, providing routing traces of precise dimensions and avoiding the problems of under-etch or over-etch. Due to the improved precision, the method allows creation of much narrower and finer gap and track features. This method allows gap and track widths of significantly less than the thickness of the leadframe. Using this process, the feature size is now independent of the thickness of the leadframe but is instead dependent on parameters associated with the front-side etch (which opens up the gap 512 and may be shallower than the corresponding etch in the process described with reference to FIGS. 3 and 4) and the thickness of the Cu plating layer 506. In an example, 20 µm track widths and gap widths of 30-50 µm or smaller may be achievable for a Cu plating layer 506 which is around 10 µm thick.

Figure 6A:
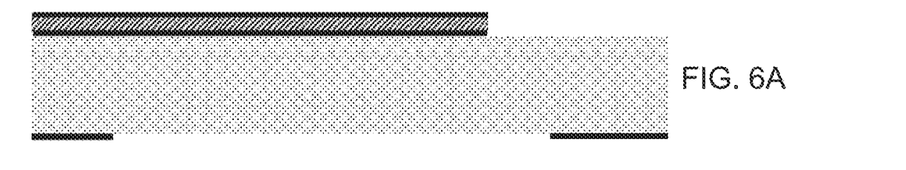
FIGS. 6A-6F are schematic diagrams showing cross-sectional views of an ARQFN package during an exemplary process for fabricating the ARQFN package according to a first embodiment and where the die is mounted in a recess in the leadframe.
Figure 6B:
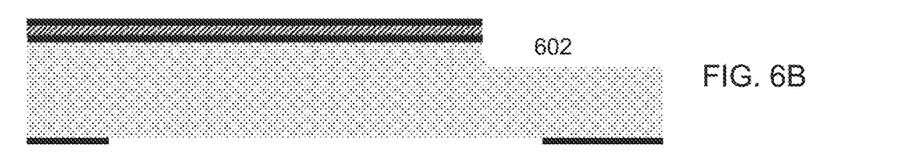
Figure 6C:
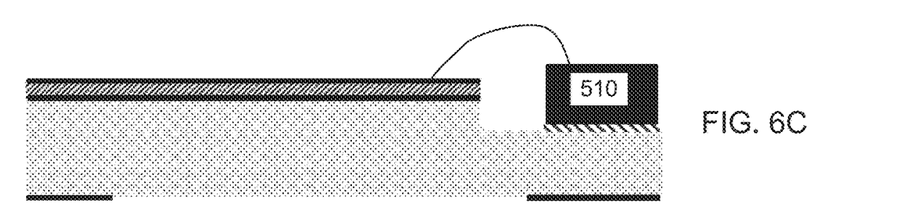
Figure 6D:
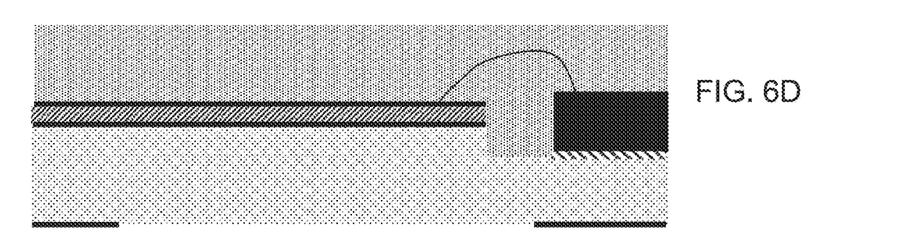
Figure 6E:
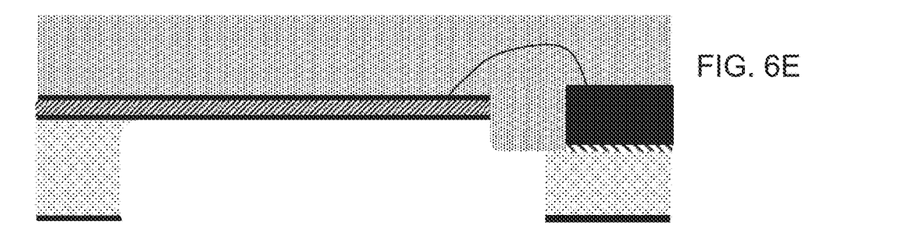
Figure 6F:
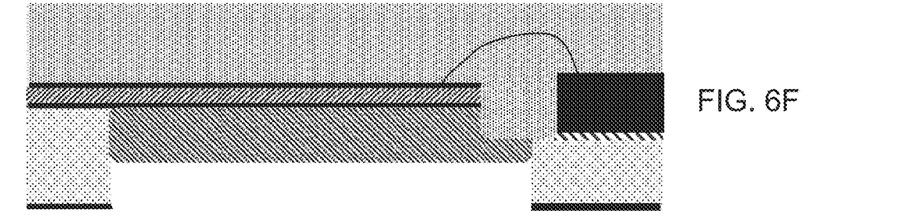

FIGS. 6A-6F are schematic diagrams showing cross-sectional views of another ARQFN package during its various fabrication stages which is a variation on that shown in FIGS. 5A-5F. This example is the same as that shown in FIGS. 5A-5F with the exception that the die 510 (only part of which is shown in FIGS. 6A-6F) is mounted in an etched recess 602 which is formed by the front-side etch (as shown in FIG. 6B). The difference is achieved by using a different mask pattern (for the front-side plating of layers 504, 506 and 508) compared to FIGS. 5A-5F. In this example, the front-side etch is controlled so that it etches a recess for the die which is of the required depth and as a result, the front-side etch may be deeper than that used for the process shown in FIGS. 5A-5F described above.

FIGS. 7A-7G are schematic diagrams showing cross-sectional views of an ARQFN during a process for fabricating the aQFN according to a second embodiment.

The method of the FIGS. 7A-7G differs from that illustrated by FIGS. 5A-5F in that the routing trace formed in the Cu plating layer is protected by side plating against sideway etching during the front-side etch. This results in more precise control of routing trace size and as a result smaller minimum feature widths can be used (e.g. gap and track widths of around 10 µm).

Figure 7A:
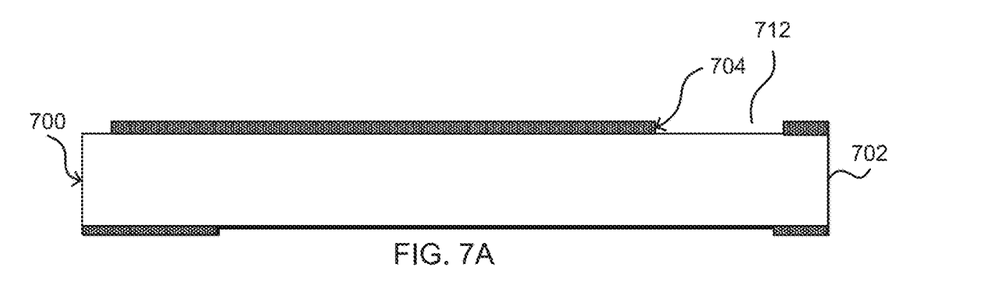
FIGS. 7A-7G are schematic diagrams showing cross-sectional views of an ARQFN package during an exemplary process for fabricating the ARQFN package according to a second embodiment and where the die is not mounted in a recess in the leadframe.

Referring to FIG. 7A, to fabricate a leadframe 700, firstly an etch-stop plating layer 704 is formed on the topside of Cu substrate 702. The etch-stop plating layer 704 may be made of Ni, NiPd or NiPdAu. The etch-stop plating layer 704 has at least one gap 712. The gap 712 may be formed by a first photolithography process with the aid of photoresist: firstly a uniform photoresist layer is formed on the topside of the Cu substrate 702; certain parts of the photoresist layer are then exposed to UV light through a first mask so that the exposed parts of the photoresist becomes soluble to photoresist developer; then the exposed parts of the photoresist are washed away by photoresist developer or removed by any other suitable means, leaving the unexposed parts of the photoresist on the topside of the Cu substrate 702; and the etch-stop plating layer 704 is then plated on the topside of the Cu substrate 702 in places where no photoresist is present.

Figure 7B:
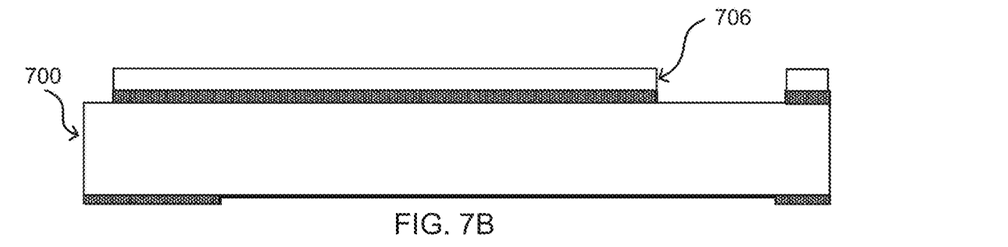
Figure 7C:
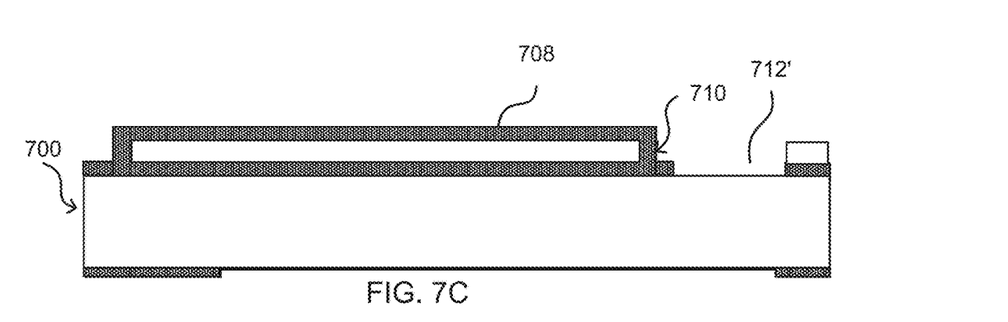

Subsequently, as shown in FIG. 7B, a Cu plating layer 706 is formed on the topside of a portion of the etch-stop plating layer 704. All photoresist is then removed by photoresist developer or by any other suitable means. Then a second photolithography process is performed and photoresist is applied to the topside of the leadframe 700. The photoresist is then exposed to UV light through a second mask with a wider opening, so that portions of the photoresist immediately abutting the ends of the etch-stop plating layer 704 are exposed to the UV light and can be washed away by photoresist developer or removed by any other suitable means. This leaves small gaps at the ends of the etch-stop plating layer 704. Then the topside of the leadframe 700 is plated, resulting in a top plating layer 708 and side plating layer 710 as shown in FIG. 7C. Then the remaining photoresist is removed by photoresist developer or by any other suitable means to form the at least one gap 712' (which is slightly narrower than the original gap 712), leaving only plating layers 704, 706, 708 and 710 on the Cu substrate 702.

As illustrated in FIG. 7C, the Cu plating layer 706 is sealed by the top plating layer 708, side plating 710 and the etch-stop plating layer 704. The Cu plating layer 706 is sealed by plating on each of its surfaces, although its front and back surfaces are not visible from FIG. 7C. The top plating layer 708 and the side plating 710 may be made of NiPdAu.

Figure 7D:
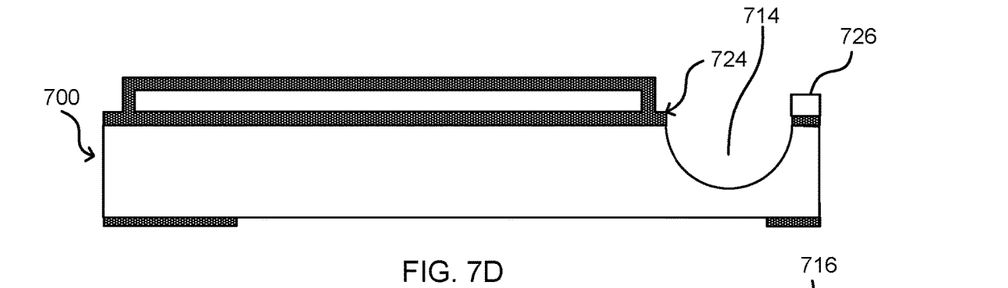

As shown in FIG. 7D, subsequently the Cu substrate 702 is partially etched from its topside at the gap 712' to form a cavity 714 to separate a routing trace 724 from a die supporting portion 726 and also to laterally separate parts of the Cu plating layer 706 forming different routing traces 724 (i.e. where there are a plurality of routing traces 724). The Cu substrate may be partially etched using any known etchant suitable for etching copper or copper alloy. The top plating layer 708 and the side plating 710 are resistant to the etchant and protect the underlying portions of the Cu substrate and the enclosed Cu plating layer from etching.

Figure 7E:
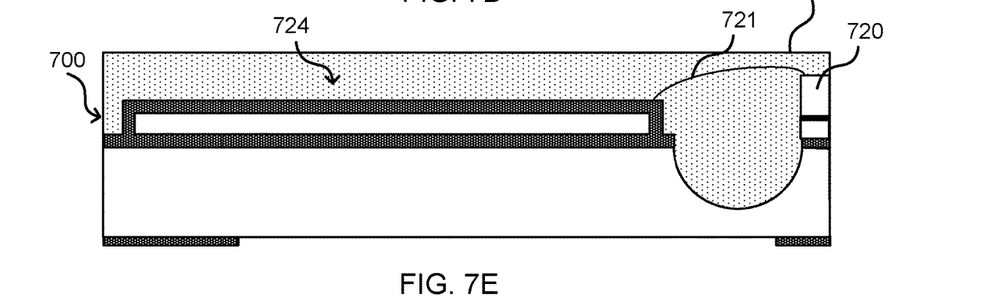
Figure 7F:
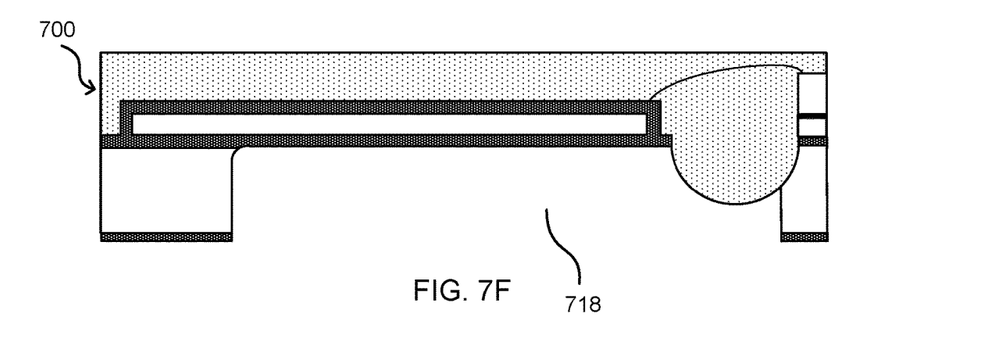
Figure 7G:
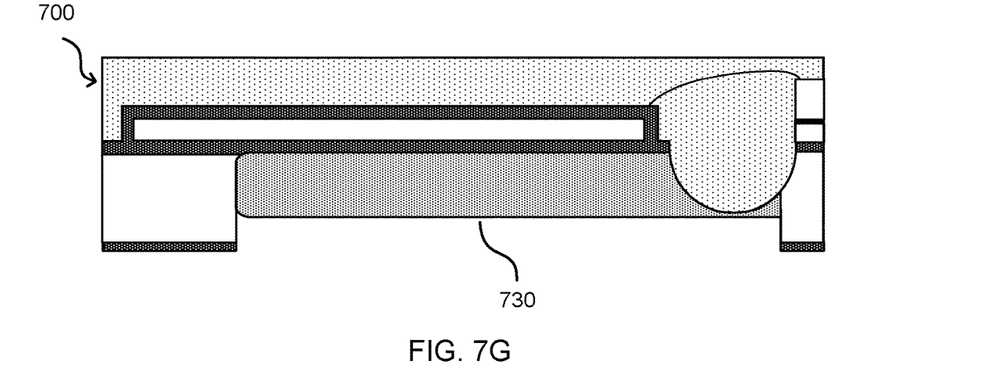

The remainder of the process is as described above with reference to the first embodiment. A die 720 is then attached to a portion of the top plating layer of the leadframe 700 and at least one wire 721 is then wirebonded between the die 720 and the routing trace 724. The at least one wire 721 may be made of gold or any other conductive material suitable for electrically coupling the die and the routing trace. Molding is then performed on the topside of the leadframe such that resin 716 is deposited on the leadframe and solidified to hold the wire 721 permanently in place and hold the die, the wire and the leadframe assembly together into an integral piece, as shown in FIG. 7E. As illustrated in FIG. 7F, the Cu substrate 702 then undergoes a backside etching process to form a cavity 718. The backside etching of the copper substrate 702 stops at the etch-stop plating layer 704 which is resistant to the etchant and protects the Cu plating layer 706 (which forms the routing traces) against etching. As shown in FIG. 7G, the exposed underside of the leadframe in the cavity 718 may be protected using soldermask material 730.

Figure 8A:
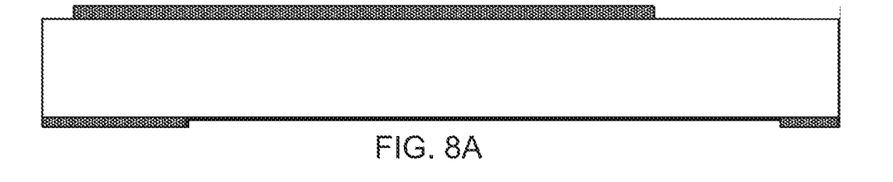
FIGS. 8A-8G are schematic diagrams showing cross-sectional views of an ARQFN package during an exemplary process for fabricating the ARQFN package according to a second embodiment and where the die is mounted in a recess in the leadframe.
Figure 8B:
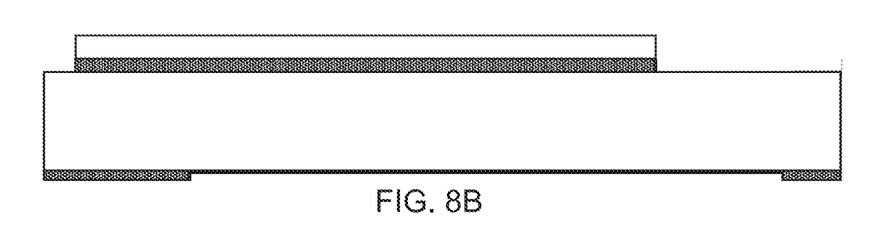
Figure 8C:
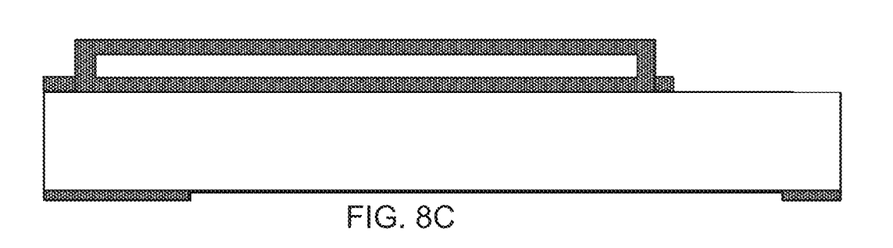
Figure 8D:
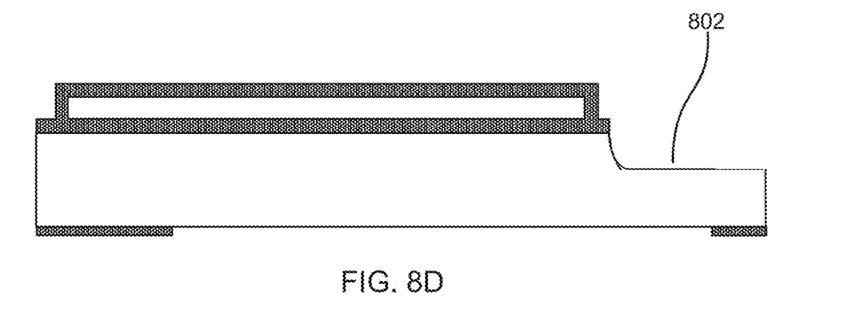
Figure 8E:
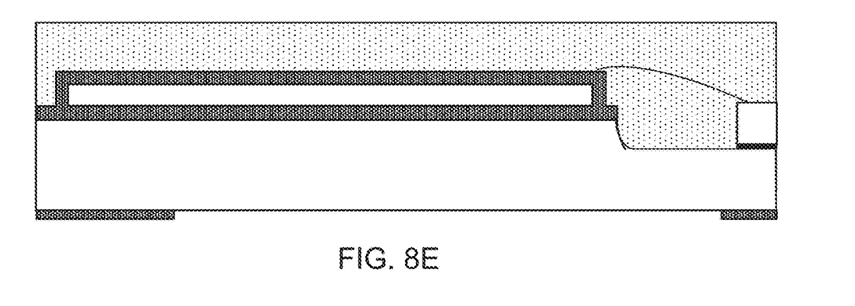
Figure 8F:
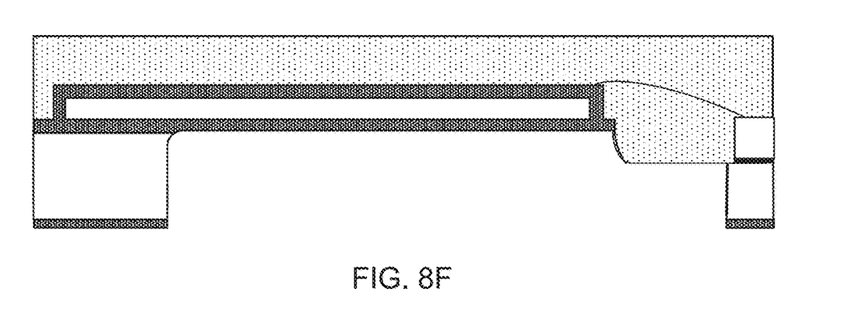
Figure 8G:
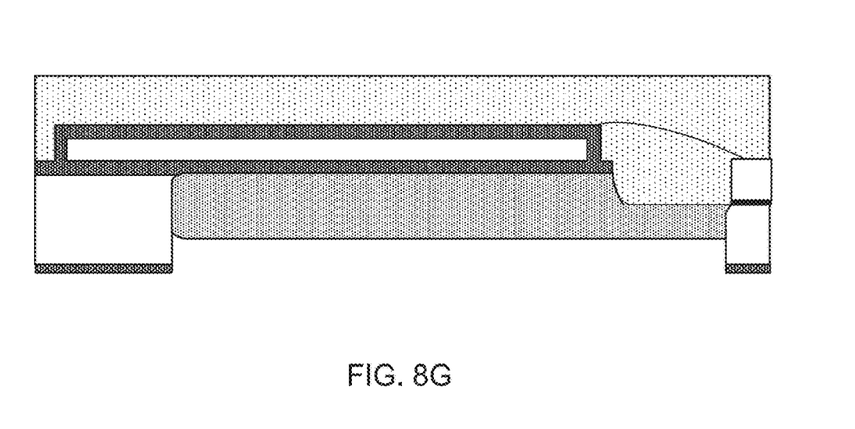

FIGS. 8A-8G are schematic diagrams showing cross-sectional views of another ARQFN package during its various fabrication stages which is a variation on that shown in FIGS. 7A-7G. This example is the same as that shown in FIGS. 7A-7G with the exception that the die 720 (only part of which is shown in FIGS. 8A-8G) is mounted in an etched recess 802 which is formed by the front-side etch (as shown in FIG. 8D). The difference is achieved by using a different mask pattern (for the front-side plating of layers 704, 706, 708 and 710) compared to FIGS. 7A-7G.

Figure 9:
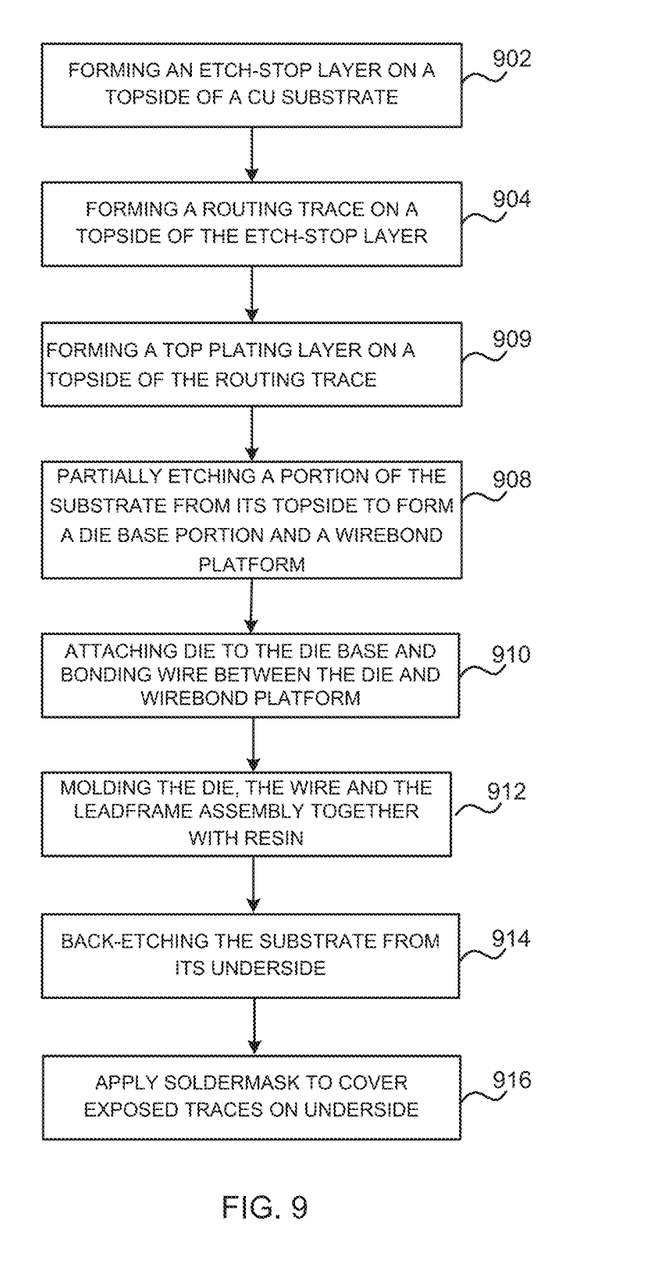
FIG. 9 is a flow diagram of a method for fabricating an ARQFN package according to the first or second embodiments.

FIG. 9 shows a flow diagram of a method for fabricating the ARQFN according to the embodiments described above. In block 902, an etch-stop layer (504, 704) is formed on a topside of the substrate (502, 702). It may be formed with the aid of photolithography such that a gap (512, 712) is formed in the etch-stop layer (504, 704) as explained above. In block 904, a routing trace in the form of copper plating (506, 706) is formed on the topside of the etch-stop layer (504, 704). In block 906, a top plating layer (508, 708) is formed on the topside of the routing trace. According to the second embodiment described above, side plating 710 sealing a side wall of the copper plating (606) may also be formed. Also as described above, the top plating layer (708) and the side plating 710 may be formed in a second photolithography process with a mask wider than that used in the first photolithography process in block 902.

In block 908, a portion of the substrate at the gap 512 and 712' is partially etched from its topside to form a die base portion and a routing trace (522, 724). The side plating 710, in the second embodiment, protects the Cu plating layer (506), i.e. the routing trace, against sideway etching. In block 910, a die is attached to the leadframe and a pad on the die is electrically connected to the top plating layer of the routing with a wirebond. In block 912, molding is then performed on the topside of the leadframe such that resin (514, 716) is deposited on the leadframe and solidified to hold the wirebonds permanently in place, and hold the die, the wirebonds and the leadframe assembly together into an integral piece. In block 914, the substrate is back-etched from its underside. The etch-stop plating layer 504, 704 which is resistant to the etchant protects the Cu plating layer (506, 706), i.e. the routing trace, against etching. In block 916, the exposed underside of the leadframe in the cavity (518, 718) may be subsequently protected using soldermask material (520, 730).

It will be appreciated that although the embodiments described above refer to an ARQFN comprising a single die, in other examples, the ARQFN may comprise more than one die and/or other discrete components which may be attached when forming the leadframe and die assembly.

It will also be appreciated that although the embodiments described only describes an ARQFN with a single wirebond between a die and a routing trace, in other examples, there may be a plurality of wirebonds between the die and a respective routing trace.

It will be appreciated that although the diagrams show a leadframe and its various layers and components with sharp, right angle corners, there may in reality be rounded (e.g. as a result of processing artefacts). Partial etching of the leadframe can also result in rounded corners.

It will be appreciated that although in the method described above a positive photoresist is used, negative photoresist can also be used in lieu of the positive photoresist. Positive photoresist is a type of photoresist that when being exposed to light becomes soluble to the photoresist developer. Negative photoresist is a type of photoresist that when being exposed to light becomes insoluble to the photoresist developer. The photoresist may be any kind of photoresist suitable for achieving the aim in the above methods, including the dry film resist. The copper plating and copper substrate may be made of a copper alloy. It will also be appreciated that other techniques to create patterns metal layers may be used instead of photolithography.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A leadframe assembly for use in fabricating a QFN package, the leadframe assembly comprising
   a substrate;
   a routing trace comprising a first portion routing trace having a top side and at least one side wall and a second portion routing trace separated from the first portion routing trace, the second portion routing trace located over a die supporting portion of the substrate;
   an etch-stop layer comprising a first portion etch-stop layer positioned between a topside of the substrate and an underside of the routing trace and further comprising a second portion etch-stop layer separated by a cavity from the first portion etch-stop layer over the die supporting portion of the substrate, wherein the etch-stop layer is arranged to prevent etching of the underside of the routing trace;
   a top plating layer coupled to a topside of the routing trace and sealing the topside of the routing trace;
   at least one side plating layer formed on the at least one side wall of the routing trace and sealing the at least one side wall of the routing trace, wherein the first portion etch-stop layer extends beyond the at least one side plating layer in a direction toward the die supporting layer;
   the die supporting layer coupled to a topside of the second portion etch-stop layer;
   a die coupled to a topside of the die supporting layer; and
   a wire spanning a portion of the cavity and configured to electrically couple the top plating layer to the die.

2. A leadframe assembly according to claim 1, wherein the substrate and the routing trace are made of copper alloy.

3. A leadframe assembly according to claim 2, wherein the etch-stop layer is made of one of Ni, NiPd and NiPdAu.

4. A leadframe assembly according to claim 1, wherein the cavity is approximately 20 µm or less.

5. A QFN package comprising:
   a leadframe assembly comprising a substrate, a routing trace comprising a first portion routing trace having a top side and at least one side wall and a second portion routing trace separated from the first portion routing trace, the second portion routing trace located over a die supporting portion of the substrate, and an etch-stop layer comprising a first portion etch-stop layer positioned between a topside of the substrate and an underside of the routing trace and further comprising a second portion etch-stop layer separated by a cavity from the first portion etch-stop layer over the die supporting portion of the substrate, wherein the etch-stop layer is arranged to prevent etching of the underside of the routing trace;
   a top plating layer coupled to the topside of the routing trace and sealing the topside of the routing trace;
   at least one side plating layer formed on the at least one side wall of the routing trace and sealing the at least one side wall of the routing trace, wherein the first portion etch-stop layer extends beyond the at least one side plating layer in a direction toward the die supporting layer;
   the die supporting layer coupled to a topside of the second portion etch-stop layer;
   a die coupled to a topside of the die supporting layer;
   a wire spanning a portion of the cavity and configured to electrically couple the die to the top plating layer of the leadframe assembly; and
   molding material bonding the die, the wire and the leadframe assembly together.

6. A QFN package according to claim 5, wherein the substrate and the routing trace are made of copper alloy.

7. A QFN package according to claim 6, wherein the etch-stop layer is made of one of Ni, NiPd and NiPdAu.

8. A QFN package according to claim 5, wherein the molding material is deposited on a topside of the leadframe assembly and extends into the substrate below the etch-stop layer.

* * * * *